United States Patent [19]
Grothe et al.

[11] Patent Number: 5,983,646
[45] Date of Patent: Nov. 16, 1999

[54] COOLING APPARATUS FOR A HIGH-FREQUENCY RECEIVER

[75] Inventors: Wolfgang Grothe, Tiefenbronn; Matthias Klauda, Erlangen; Claus Schmidt, Magstadt, all of Germany

[73] Assignee: Robert Bosch GmbH, Stuttgart, Germany

[21] Appl. No.: 08/952,985

[22] PCT Filed: May 28, 1996

[86] PCT No.: PCT/DE96/00922

§ 371 Date: Dec. 2, 1997

§ 102(e) Date: Dec. 2, 1997

[87] PCT Pub. No.: WO96/39742

PCT Pub. Date: Dec. 12, 1996

[30] Foreign Application Priority Data

Jun. 3, 1995 [DE] Germany ............ 195 20 506

[51] Int. Cl.$^6$ ............................................. F25B 9/00
[52] U.S. Cl. ........................... 62/6; 62/51.1; 62/293.2
[58] Field of Search ................. 62/6, 51.1, 293.2

[56] References Cited

U.S. PATENT DOCUMENTS

| 4,392,362 | 7/1983 | Little | 62/293.2 |
| 5,197,295 | 3/1993 | Pundak | 62/6 |
| 5,343,707 | 9/1994 | Sata | 62/6 |

OTHER PUBLICATIONS

R. Radebaugh, "A Review of Pulse Tube Refrigeration", Advances of Cryogenic Engineering, vol. 35, 1990, pp. 1191–1205.

Primary Examiner—Ronald Capossela
Attorney, Agent, or Firm—Kenyon & Kenyon

[57] ABSTRACT

In a cooling apparatus for a high-frequency receiver having an input circuit which carries signals that are not yet sufficiently amplified, the input circuit is thermally connected to a miniature cooler and is thermally insulated, including a cold output of the miniature cooler, from the environment. It is particularly favorable if the miniature cooler has no moving parts on the cooling end. The miniature receiver is preferably configured as a pulse tube cooler.

3 Claims, 1 Drawing Sheet

COOLING APPARATUS FOR A HIGH-FREQUENCY RECEIVER

FIELD OF THE INVENTION

The present invention relates to a cooling apparatus.

BACKGROUND INFORMATION

The noise of a high-frequency receiver, which limits the reception of weak signals, is created for the most part in the ohmic sections of the input circuit or input filter, and in the amplifier stage downstream thereof. Depending on the detailed configuration of these components, this also applies to the shielding or grounding surfaces. Noise can be reduced to one-third by cooling to temperatures of, for example, less than 80K.

It is the object of the present invention to indicate a cooling apparatus with which the noise of a high-frequency receiver can be substantially reduced, such that the power required for cooling, and the outlay for insulating the components being cooled, are to be minimized.

According to the present invention, this object is achieved by the fact that the input circuit is thermally connected to a miniature cooler and is thermally insulated, including a cold output of the miniature cooler, from the environment.

Depending on the specific prerequisites, the input circuit can contain an input filter and/or an amplifier stage, in particular a transistor.

SUMMARY OF THE INVENTION

The cooling apparatus according to the present invention has the advantage that the components to be cooled occupy an extremely small volume that can be thermally insulated from the environment with little outlay, so that the cooling power to be applied is also low.

This small volume is moreover much easier to protect against the penetration of moisture, which would result in icing of cavities or surfaces inside the region to be cooled and thus in an impairment of the function of the high-frequency receiver.

Depending on the cooling output used, cooling with the apparatus according to the present invention leads to a considerable reduction in noise. As a result, for example, the number of subscribers and/or the cell size of a digital mobile radio network can be greatly increased.

Long maintenance intervals and high reliability are particularly important for high-frequency receivers in general, and in particular with those which are operated at inaccessible locations. Provision is therefore made, in a development of the apparatus according to the present invention, for the miniature cooler to have no moving parts on the cooling end. The miniature cooler is preferably a pulse tube cooler.

These developments are particularly advantageous because the use of lubricants is problematical or impossible in the case of highly cooled mechanically moving parts. Suitable pulse tube coolers are described, for example in the article by Ray Radebaugh, "A Review of Pulse Tube Refrigeration," Advances of Cryogenic Engineering, Vol. 35, Plenum Press, New York 1990, pages 1191 to 1205; and in data sheets of the Iwatani International Corporation, Tokyo: "New CryoMini PTRE," 1994.2, and "Main Specifications of 'NEW PTRE' Model P201," April/95.

DETAILED DESCRIPTION OF THE INVENTION

Figure 1:
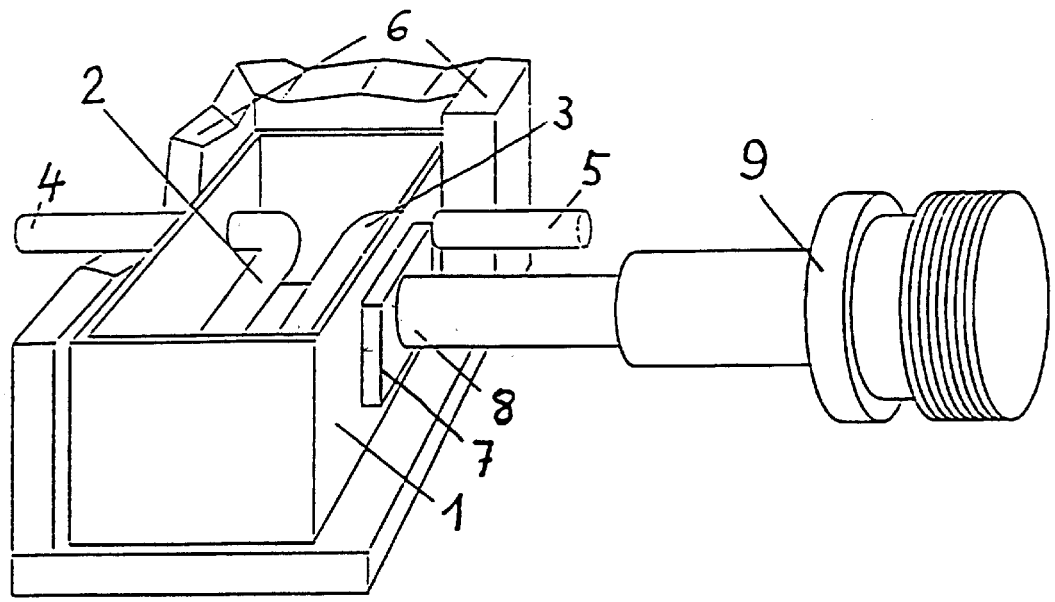
FIG. 1 illustrates a schematic depiction of a first embodiment according to the present invention.

In the exemplifying embodiment according to FIG. 1, the component to be cooled is a filter having a housing 1 and filter elements 2, 3 (e.g., an input circuit). The signals to be filtered are introduced at 4, and filtered signals are taken out at 5. Housing 1 is surrounded by thermal insulation 6 which consists of a suitable material, for example Styrofoam, and is shown cut away in FIG. 1 so that the filter is visible.

In order to dissipate heat from housing 1, which is preferably made of copper, a heat conductor 8, in the form of a cylinder preferably also made of copper, is attached via a plate 7. The thermal insulation of heat conductor 8, which is required per se, is not shown in FIG. 1 for the sake of clarity. The other end of heat conductor 8 is connected to a cold end 20 of a pulse tube cooler 9 which is thermally insulated from the environment. The pulse tube cooler is, for example, known from the aforesaid article, and does not need to be described in detail in order to explain the invention.

Figure 2:
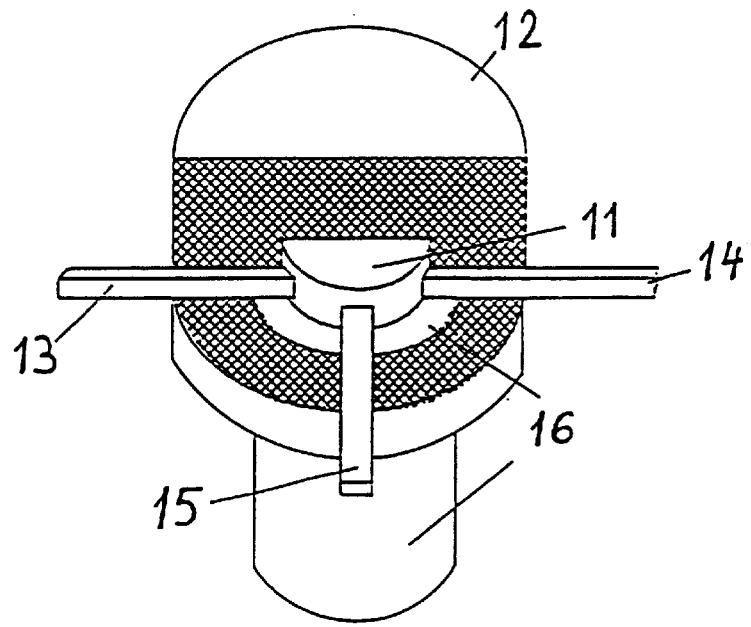
FIG. 2 illustrates a second embodiment according to the present invention.

In the exemplifying embodiment according to FIG. 2, the component to be cooled is a high-frequency transistor 11 (e.g., the input circuit) which constitutes, for example, the first amplifier stage of a receiver. Transistor 11 is completely enclosed by thermal insulation 12, from which only terminals 13, 14, 15 project. The transistor is connected in thermally conductive fashion, via a thermal conductor 16, to a miniature cooler (not depicted). In the case of FIG. 2 as well, a depiction of the heat insulation of thermal conductor 16 was omitted, and heat insulation 12 of the transistor is shown cut away.

What is claimed is:

1. A cooling apparatus for a high-frequency receiver having an input circuit which carries signals that are not yet sufficiently amplified, the apparatus comprising:

a pulse tube miniature cooler thermally coupled to the input circuit;

wherein the input circuit and a cold output of the miniature cooler are externally thermally insulated.

2. The cooling apparatus according to claim 1, wherein the input circuit includes an input filter.

3. The cooling apparatus according to claim 1, wherein the input circuit includes a transistor.

* * * * *